United States Patent
Savignac et al.

(10) Patent No.: US 6,693,447 B1
(45) Date of Patent: Feb. 17, 2004

(54) CONFIGURATION FOR IDENTIFYING CONTACT FAULTS DURING THE TESTING OF INTEGRATED CIRCUITS

(75) Inventors: Dominique Savignac, Ismaning (DE); Frank Weber, Kraiburg/Inn (DE); Norbert Wirth, Unterschleissheim (DE)

(73) Assignee: Siemens Aktiengesellschaft, Munich (DE)

( * ) Notice: Subject to any disclaimer, the term of this patent is extended or adjusted under 35 U.S.C. 154(b) by 506 days.

(21) Appl. No.: 09/277,281

(22) Filed: Mar. 26, 1999

(30) Foreign Application Priority Data

Mar. 26, 1998 (DE) .......................... 198 13 503

(51) Int. Cl.⁷ .............................................. G01R 31/26
(52) U.S. Cl. ...................................................... 324/765
(58) Field of Search ................... 324/765, 754, 324/763, 758

(56) References Cited

U.S. PATENT DOCUMENTS

| | | | |
|---|---|---|---|
| 5,444,715 A | 8/1995 | Gruetzner et al. | 714/727 |
| 5,621,741 A | 4/1997 | Kohiyama | 714/744 |
| 5,670,890 A | 9/1997 | Colwell et al. | 324/765 |
| 5,818,251 A | * 10/1998 | Intrater | 324/765 |
| 5,859,442 A | * 1/1999 | Manning | 324/754 |

FOREIGN PATENT DOCUMENTS

EP  0 075 079 A1  3/1983

* cited by examiner

*Primary Examiner*—N. Le
*Assistant Examiner*—James Kerveros
(74) *Attorney, Agent, or Firm*—Laurence A. Greenberg; Werner H. Stemer; Ralph E. Locher

(57) ABSTRACT

A configuration for identifying contact faults during the testing of integrated circuits with a multiplicity of pins which protrude from a housing and are connected to respective pads on a semiconductor body of the integrated circuit. Pull-up or pull-down devices are connected between respective pads and input buffers and in each case hold the pads at a high or low potential by impressing a holding current, if contact has not been made with a pin associated with the pad during testing, the result being that activation of the circuit section connected to the pin is avoided.

8 Claims, 2 Drawing Sheets

CONFIGURATION FOR IDENTIFYING CONTACT FAULTS DURING THE TESTING OF INTEGRATED CIRCUITS

BACKGROUND OF THE INVENTION

FIELD OF THE INVENTION

The present invention relates to a configuration for identifying contact faults during the testing of integrated circuits with a multiplicity of pins which protrude from a housing of the integrated circuit and are connected to respective pads on a semiconductor body of the integrated circuit.

Integrated circuits such as, in particular, memory modules are subjected to a test with regard to their functionality in a tester before being incorporated in an apparatus, for example a personal computer. It is the case, however, especially in memory modules, such as SDRAMs, for example, that the majority of control inputs are active "low", i.e. the control inputs are activated when a low potential or no potential is applied to them.

If contact problems arise in a tester or else in a "burn-in oven" such that contact is not made with all the desired pins, then circuits of pins with which contact has not been made in the integrated circuit can behave like activated circuits. This leads to incorrect measurement results especially in the case of the burn-in process.

Therefore, after passing through a testing unit, integrated circuits may be incorrectly classified as "pass" or completely satisfactory even though the integrated circuits in some instances contain faults and should be assessed as "fail".

Thus, experiments have been carried out in which pins were disconnected or broken off from integrated circuits before the latter were introduced into a tester. Contact could not, of course, be made with the terminals with the broken-off pins in the tester. Nevertheless, a large number of such integrated circuits were assessed as "pass" since their control inputs with the broken-off pins are active "low" and, consequently, behave as if they were activated internally in the tester.

The above problems are aggravated in integrated circuits of so-called TSOP modules (TSOP="Thin Small Outline Package"), that is to say in modules which are distinguished by a particularly planar form. This is probably due to the fact that as the miniaturization of the modules advances, the testing thereof imposes ever more stringent requirements. In order to surmount this difficulty, the following concept has already been conceived of, namely that of avoiding possible contact problems in the tester by testing the TSOP modules while still in the "unbent" state, that is to say by introducing the modules into the tester before the pins are prepared and shaped. Although better contact-making of the pins is inherently achieved as a result of this, a procedure of this type nonetheless requires special receptacles in the tester, which ultimately makes the test operation complicated and costly. In addition, it has been shown that even when the TSOP modules are tested with the pins in the unbent state, faults can occur, with the result that modules are allocated the assessment "pass" even though contact has not been made with all of the desired pins in the tester.

SUMMARY OF THE INVENTION

It is accordingly an object of the invention to provide a configuration for identifying contact faults during the testing of integrated circuits that overcomes the above-mentioned disadvantages of the prior art devices of this general type, which surmounts the above difficulties and reliably guarantees that the only integrated circuits which are classified as "good or pass" are those which have actually been checked for their functionality.

With the foregoing and other objects in view there is provided, in accordance with the invention, an integrated circuit configuration for identifying contact faults during testing of the integrated circuit configuration: including: a semiconductor body; pads disposed on the semiconductor body; input buffers connected to the pads and defining a connection node between each respective pad and a respective input buffer; a housing protecting the semiconductor body; a multiplicity of pins protruding from the housing and connected to the pads; and a pull-up or pull-down device connected to the connection node between the respective pad and the respective input buffer, the pull-up or pull-down device holding the respective pad at a high or low potential by impressing a holding current if contact has not been made with a pin associated with the respective pad during testing resulting in avoiding activating a circuit section connected to the pin associated with the respective pad.

In the case of a configuration of the type mentioned in the introduction, the object is achieved according to the invention by the pull-up or pull-down devices connected between respective pads and the integrated circuit. The devices in each case hold the pads at a high or low potential by impressing a holding current, if contact has not been made with the associated pin during testing, with the result that activation of the circuit section connected to the pin is avoided.

The invention therefore takes a fundamentally different approach from that of the previous prior art. Instead of making further improvements to the tester itself or implementing measures which enable reliable contact to be made with the pins by the tester, the testing is undertaken by a pull-up or pull-down device incorporated in the integrated circuit. Thus, a pull-up device pulls up the potential at the pins with which contact has not been made, with the result that these pins, which are inherently active "low", are no longer assessed as activated. Even if, therefore, contact has not been made with a number of pins in the tester, it is ensured that the potential of the pins is raised, so that the pins change from the activated state to the inactivate state during the test operation. In other words activation of the connected circuit is avoided. The pull-down device operates in a manner of "mirror-inverted" with respect to the pull-up device. It pulls the potential at a pad connected to a pin with which contact has not been made to a low value, thereby avoiding activation of the connected circuit, which is otherwise activated at a high potential.

Modules in which pads connected to pins with which contact has not been made are held at a high or low potential by the pull-up or pull-down device are straightforwardly identified as "fail" in the tester, so that the quality of the pass modules is reliably ensured.

As is known, the input leakage specification (input leakage current specification) of module inputs is very narrow and is currently in the region of ±1 $\mu$A in the case of SDRAMs compared with ±10 $\mu$A in the case of standard EDO DRAMs. A "bleeder" at each input pad is virtually impossible therefore, because the maximum leakage currents tolerated by customers is in the region of 10 nA. Therefore, the pull-up or pull-down device is in a first active state during the test mode or burn-in mode and/or during the switch-on phase of the module. The current capacity of the device is chosen to be large enough that undesired switching of input circuits which are connected to the relevant pad and with which contact has not been made is reliably avoided, but without the function of the module being disrupted. During normal operation, the pull-up or pull-down device is either completely switched off or in a second active state, its current capacity being lower than in the first state and being dimensioned in such a way that the normal function of the module is not adversely affected and, in a computer system, the sum of the input leakage currents does not exceed a tenable amount.

Other features which are considered as characteristic for the invention are set forth in the appended claims.

Although the invention is illustrated and described herein as embodied in a configuration for identifying contact faults during the testing of integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
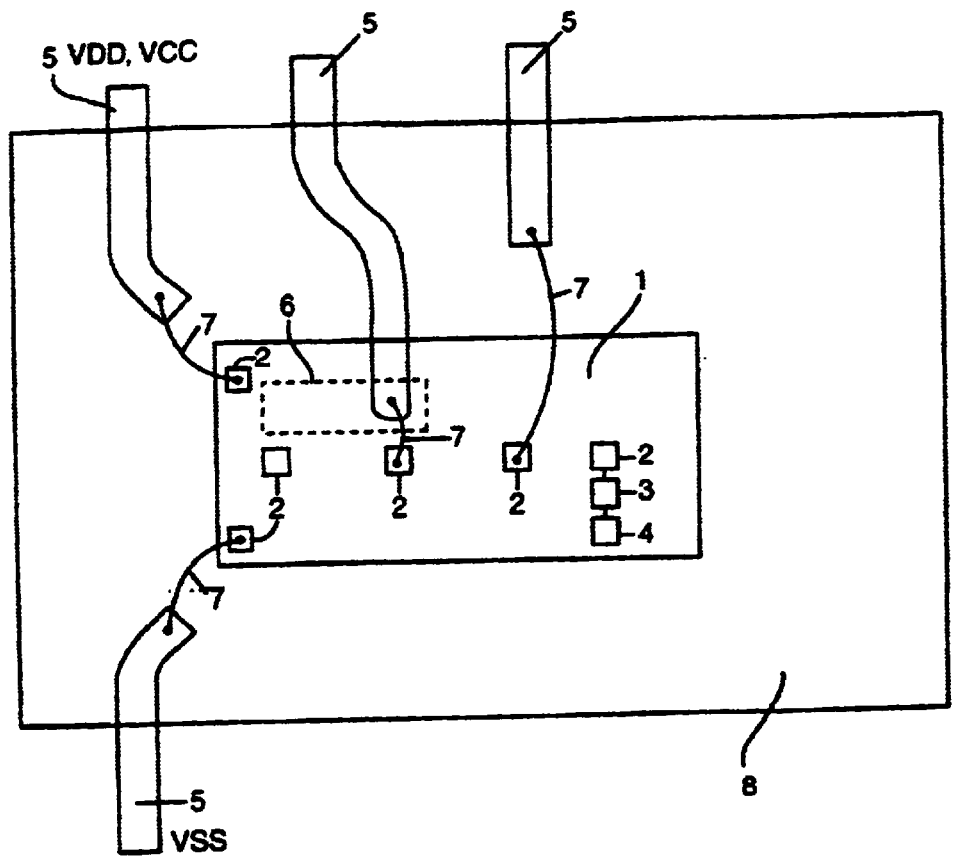
FIG. 1 is a diagrammatic, plan view of an integrated circuit or a module according to the invention.

In all the figures of the drawing, sub-features and integral parts that correspond to one another bear the same reference symbol in each case. Referring now to the figures of the drawing in detail and first, particularly, to FIG. 1 thereof, there is shown a plan view of a semiconductor body (silicon chip) 1 on which pads 2 are provided. The pads 2 are composed of aluminum, for example, and are connected to a protective structure 3 and an input or input/output buffer 4 in the semiconductor body 1 (cf. the right-hand pad 2 in FIG. 1). The buffer 4 is followed by further circuits in the semiconductor body 1, so that overall an integrated circuit is embodied in the semiconductor body 1.

Contact is made with the pads 2 via pins 5 formed, by way of example, from a standard lead frame made of copper or with LOC mounting (LOC="Lead On Chip"). In the case of LOC mounting, the conductor associated with the pin 5 is routed as far as the semiconductor body 1 and isolated from the latter by an adhesive tape 6. Gold bonding wires 7 finally connect the lead frame or pins 5 to the pads 2.

A high potential VDD and/or VCC and a low potential VSS are also fed via the pins 5 to the semiconductor body 1 or the integrated circuit constructed therein.

The semiconductor body 1 with the pads 2, the bonding wires 7 and the ends of the pins 5 or conductor tracks is finally encapsulated in a synthetic composition 8 made of epoxy resin, by way of example.

In order to provide better clarity, only a few pins 5 are shown in FIG. 1, and the semiconductor body 1 and also the pads 2, the bonding wires 7, the protective structure 3 constructed in the semiconductor body 1 and the buffer 4 likewise constructed in the semiconductor body 1 are illustrated with solid lines, as are the parts of the conductor tracks and pins which are situated internally, even though these parts cannot be seen per se in the plan view shown.

Such a module of the kind illustrated in FIG. 1 (obviously with a very large number of pins) is placed in a tester, in which test voltages are applied to the exposed ends of the pins 5. Since memory modules, such as SDRAMs, for example, usually have "active low" inputs, circuits connected to the pins 5 with which contact has not been made, or to the pads 2 thereof, in the integrated circuit behave like activated circuits in the tester. The result being that, in the test, possible faults cannot be identified and the integrated circuits which ought to be assessed as "fail" are classified as "good or pass".

Figure 2:
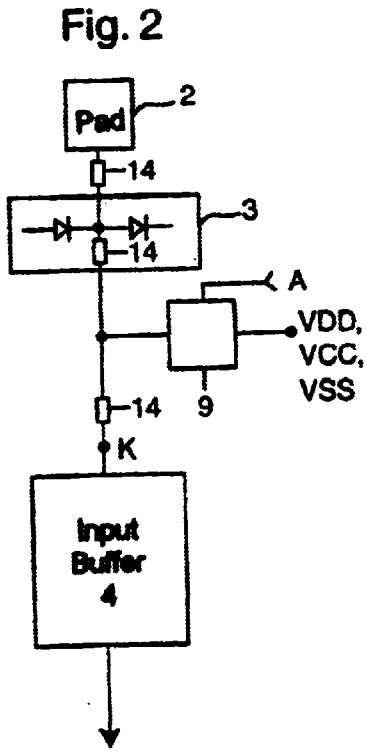
FIG. 2 is a block circuit diagram of a detail of the module from FIG. 1.

In order to surmount this difficulty, a pull-up or pull-down device 9 (cf. FIG. 2) is provided in the integrated circuit according to the invention. The device may be disposed between the pad 2 and the protective structure 3 made of diodes, for example, or between the protective structure 3 and the buffer 4 (as shown in FIG. 2). In this case, the pull-up or pull-down devices 9 may be connected to the path between the pad 2 and the buffer 4 upstream and/or downstream of optionally present resistors 14 or other components, such as e.g. an N-type well, and nodes K, if appropriate. The pull-up or pull-down device 9 causes the associated pad 2 to be held at a high or low potential if contact is not made with the pin 5 associated with the pad 2 in the tester, with the result that activation of the circuit connected to the pad 2 or to the corresponding buffer 4 is reliably avoided.

The device 9 has at least three terminals. The device 9 receives a high supply voltage VCC and/or VDD in the case of the pull-up device, and a low supply voltage VSS in the case of the pull-down device, and also a "control signal" A from the integrated circuit constructed in the semiconductor body 1 in the case of the pull-up device and pull-down device.

Figure 3:
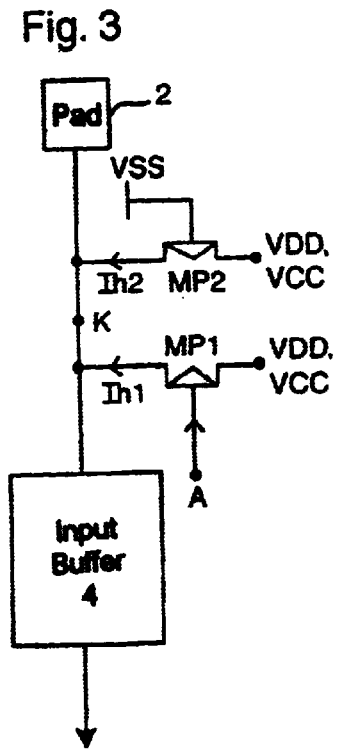
FIGS. 3 and 4 are block circuit diagrams showing two different exemplary embodiments of the integrated circuit.

FIG. 3 shows the realization of the pull-up device: a first P-channel MOS transistor MP1 is connected by a first terminal between the pad 2 and the buffer 4 upstream or downstream of the protective structure 3, which may contain resistors. Since the protective structure 3 has any desired configuration, it is omitted in FIG. 3. The other terminal of the MOS transistor MP1 is connected to high potential VCC and/or VDD. The signal A is fed to the gate of the MOS transistor MP1.

If appropriate, a second P-channel MOS transistor MP2 may additionally be provided, which is connected between the high potential VDD and/or VCC and the line connecting the pad 2 to the buffer 4 and has the low potential VSS applied to its gate.

Figure 4:
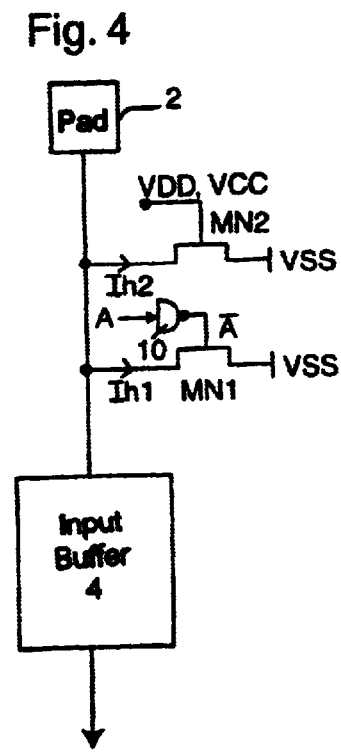

FIG. 4 shows the pull-down device with a first N-channel MOS transistor MN1, which is connected between the low potential VSS and the line connecting the pad 2 to the buffer 4, upstream or downstream of the protective structure 3 (likewise not shown in FIG. 4), and has the signal /A applied to its gate by an inverter 10.

If appropriate or optionally, a second N-channel MOS transistor MN2 may likewise additionally be provided between the low potential VSS and the line connecting the pad 2 to the buffer 4. The second MOS transistor MN2 has the high potential VDD and/or VCC applied to its gate.

In FIGS. 3 and 4, the resistors and nodes of FIG. 2 are omitted for reasons of clarity. It goes without saying, however, that they can also be present here.

Figure 5:
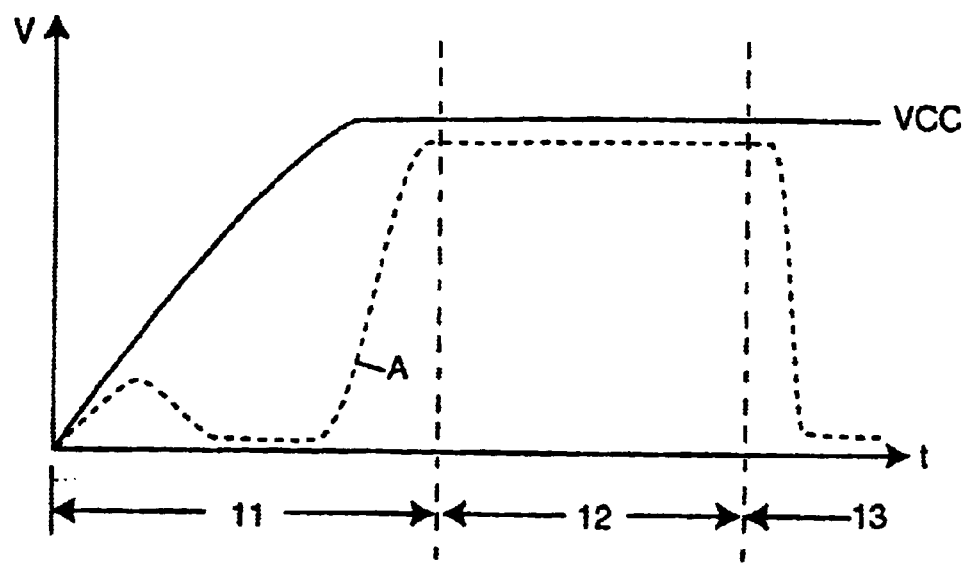
FIG. 5 is a graph of the voltage at pads connected to pins with which contact has not been made.

The operation of the pull-up or pull-down device 9 will be explained in more detail below with reference to FIG. 5.

Upon application of the supply voltage VCC, the latter rises relatively rapidly in a "power-up phase" 11, while the voltage A is raised only slowly. In this first state, therefore, A is low, which means that the first P-channel MOS transistor MP1 (FIG. 3) is switched on. The first N-channel MOS transistor MN1 is likewise switched on. As a result, a holding current Ih1 of approximately 10 μA flows both in the pull-up device and in the pull-down device. The same also applies to a test mode and/or burn-in mode 13, in which the voltage A falls rapidly. During normal operation 12, the voltage A is high, with the result that the first P-channel MOS transistor MP1 and the first N-channel MOS transistor MN1 are in each case switched off.

If the pull-up device and/or the pull-down device additionally contain the respective second MOS transistors MP2 and/or MN2, then both the transistors MP1, MP2 and/or MN1 and MN2 are both switched on in the first state (power up phase 11 and test mode 13) if the voltage A is low. The holding current is then produced from the sum of the holding currents Ih1 of the transistor MP1 and/or MN1 and of the holding current Ih2, amounting to approximately 5 nA, of the respective second transistor MP2 and/or MN2. In the second state (normal operation 12), the respective second transistors MP2 and/or MN2 are switched on, while the first transistors MP1 and/or MN1 are switched off. The holding current Ih2 of the order of magnitude of 5 nA is then present in this case.

For the respective second transistors MP2 and/or MN2, it is also possible to use, if appropriate, P-channel transistors with a minimal gate length, the gate thereof likewise having the high voltage VCC and/or VDD applied to it, or resistors (for pull-up device) or N-channel resistors with a minimal gate length, the gate thereof having VSS applied to it, or likewise resistors.

The pull-up device is particularly suitable for inputs of SDRAMs such as CS, WE, CAS, RAS, U/L DQM, A0 to 13, CLK. The pull-down device, in contrast, is particularly advantageous for the CKE input in SDRAMs.

We claim:

1. An integrated circuit configuration for identifying contact faults during testing of the integrated circuit configuration, comprising:

a semiconductor body;

pads disposed on said semiconductor body;

input buffers connected to said pads and defining a connection node between each respective pad and a respective input buffer;

a housing protecting said semiconductor body;

a multiplicity of pins protruding from said housing and connected to said pads; and a pull-up device connected to said connection node between said respective pad and said respective input buffer, said pull-up device holding said respective pad at a high potential by impressing a holding current if contact has not been made with a pin associated with said respective pad during testing resulting in avoiding activating a circuit section connected to said pin associated with said respective pad, said pull-up device having a P-channel MOS transistor with a gate and connected between said connection node and a high potential, said gate receiving a voltage for controlling said P-channel MOS transistor, said pull-up device having a further P-channel MOS transistor with a further gate and connected between said connection node and the high potential said further gate receiving a low potential.

2. The configuration according to claim 1, including a resistor connected in parallel with said P-channel MOS transistor.

3. The configuration according to claim 1, including a resistor disposed between said respective pad and said respective input buffer upstream of said pull-up device.

4. The configuration according to claim 1, including a resistor disposed between said respective pad and said respective input buffer downstream of said pull-up device.

5. An integrated circuit configuration for identifying contact faults during testing of the integrated circuit configuration, comprising:

a semiconductor body;

pads disposed on said semiconductor body;

input buffers connected to said pads and defining a connection node between each respective pad and a respective input buffer;

a housing protecting said semiconductor body;

a multiplicity of pins protruding from said housing and connected to said pads; and a pull-down device connected to said connection node between said respective pad and said respective input buffer, said pull-down device holding said respective pad at a low potential by impressing a holding current if contact has not been made with a pin associated with said respective pad during testing resulting in avoiding activating a circuit section connected to said pin associated with said respective pad, said pull-down device having an N-channel MOS transistor with a gate and connected between said connection node and a low potential, said pull-down device also having an inverted voltage applied to said gate, said pull-down device having a further N-channel MOS transistor with a further gate and connected between said connection node and the low potential, said further gate receiving a high potential.

6. The configuration according to claim 5, including a resistor connected in parallel with said N-channel MOS transistor.

7. The configuration according to claim 5, including a resistor disposed between said respective pad and said respective input buffer upstream of said pull-down device.

8. The configuration according to claim 5, including a resistor disposed between said respective pad and said respective input buffer downstream of said pull-down device.

* * * * *